United States Patent
Shin

(10) Patent No.: US 9,996,144 B2
(45) Date of Patent: Jun. 12, 2018

(54) SYSTEM ON CHIP FOR REDUCING WAKE-UP TIME, METHOD OF OPERATING SAME, AND COMPUTER SYSTEM INCLUDING SAME

(71) Applicant: Samsung Electronics Co., Ltd., Suwon-si, Gyeonggi-do (KR)

(72) Inventor: Hee Dong Shin, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 114 days.

(21) Appl. No.: 15/228,342

(22) Filed: Aug. 4, 2016

(65) Prior Publication Data

US 2016/0342197 A1     Nov. 24, 2016

Related U.S. Application Data

(63) Continuation of application No. 14/337,641, filed on Jul. 22, 2014.

(30) Foreign Application Priority Data

Aug. 8, 2013    (KR) ........................ 10-2013-0094442

(51) Int. Cl.
     *G06F 9/24*          (2006.01)
     *G06F 15/177*        (2006.01)
     (Continued)

(52) U.S. Cl.
     CPC .......... *G06F 1/3287* (2013.01); *G06F 9/4401* (2013.01); *G06F 9/4408* (2013.01);
     (Continued)

(58) Field of Classification Search
CPC ..... G06F 1/3287; G06F 9/4408; G06F 9/4418
(Continued)

(56) References Cited

U.S. PATENT DOCUMENTS 5,694,600 A    12/1997   Khenson et al.
7,411,631 B1    8/2008    Joshi et al.
(Continued)

FOREIGN PATENT DOCUMENTS

JP     2006202053 A    8/2006
JP     2007108402 A    4/2007
(Continued)

OTHER PUBLICATIONS

R.O.C. Office Action/Search Report for Patent Application No. 103125843 dated Jan. 2, 2018.

*Primary Examiner* — Mark Connolly
(74) *Attorney, Agent, or Firm* — Harness, Dickey & Pierce, P.L.C.

(57) ABSTRACT

A system on chip (SoC) includes an internal read-only memory (ROM) configured to store a first boot loader; a first internal static random access memory (SRAM) configured to receive a second boot loader output from a booting device, store the second boot loader, and perform a booting sequence according to control of the first boot loader; a second internal SRAM configured to receive a third boot loader output from the booting device, store the third boot loader, and perform a wake-up sequence according to control of the first boot loader; and a dynamic random access memory (DRAM) controller configured to load an operating system (OS) from the booting device into a DRAM according to control of the second boot loader.

20 Claims, 5 Drawing Sheets

(51) Int. Cl.
  *G06F 1/32* (2006.01)
  *G06F 9/44* (2018.01)
  *G06F 13/24* (2006.01)
  *G11C 7/10* (2006.01)
  *G11C 11/406* (2006.01)

(52) U.S. Cl.
  CPC ............ *G06F 9/4418* (2013.01); *G06F 13/24* (2013.01); *G11C 7/1072* (2013.01); *G11C 11/40615* (2013.01); *Y02B 60/1282* (2013.01)

(58) Field of Classification Search
  USPC .................................................... 713/1, 2
  See application file for complete search history.

(56) References Cited

U.S. PATENT DOCUMENTS

| | | |
|---|---|---|
| 7,757,060 B2 | 7/2010 | Montero et al. |
| 2008/0082752 A1 | 4/2008 | Chary et al. |
| 2008/0114924 A1 | 5/2008 | Frayer et al. |
| 2011/0225410 A1 | 9/2011 | Hung |
| 2012/0327440 A1 | 12/2012 | Hata et al. |
| 2014/0181498 A1 | 6/2014 | Rhee et al. |

FOREIGN PATENT DOCUMENTS

| | | |
|---|---|---|
| JP | 2012068797 A | 4/2012 |
| JP | 2012216108 A | 11/2012 |
| KR | 20010085133 A | 9/2001 |
| KR | 100625167 B1 | 9/2006 |
| TW | I372973 B | 9/2012 |

SYSTEM ON CHIP FOR REDUCING WAKE-UP TIME, METHOD OF OPERATING SAME, AND COMPUTER SYSTEM INCLUDING SAME

CROSS-REFERENCE TO RELATED APPLICATIONS

This application application is a continuation of and claims priority under 35 U.S.C. §§ 120/121 to U.S. patent application Ser. No. 14/337,641, filed on Jul. 22, 2014, which claims priority under 35 U.S.C. § 119(a) from Korean Patent Application No. 10-2013-0094442 filed on Aug. 8, 2013, the disclosures of each of which are hereby incorporated by reference in their entirety.

BACKGROUND

1. Field

Example embodiments of the inventive concepts relate to a booting technique, and more particularly, to a system on chip (SoC) capable of using a boot loader for a booting sequence and a boot loader for a wake-up sequence, a method of operating the same, and a computer system including the same.

2. Related Art

In computing, the terms 'booting' and 'booting up' may refer to the initial set of operations that a computer system including a central processing unit (CPU) performs when power is supplied to the CPU. Booting may be performed when power is supplied to the computer system or when power supply to the computer system is resumed after the computer system is turned off. After the booting is completed, the computer system performs its normal operation.

The computer system may perform the booting using a boot loader. The boot loader is a computer program that loads an operating system into a main memory. When a user does not use the computer system for a predetermined period of time, the computer system may enter power-down mode in order to reduce power consumption. The computer system may performs the booting to wake up from the power-down mode.

SUMMARY

Example embodiments of the inventive concepts provide a system on chip (SoC) capable of using a boot loader used for a booting sequence and a boot loader used for a wake-up sequence independently from each other to wake up a computer system quickly from a power-down mode, a method of operating the same, and a computer system including the same.

According to example embodiments, a method of operating a system on chip (SoC), an SoC, and an application processor may selectively use one of two boot loaders stored in different locations to initiate an operating system (OS) code. According to example embodiments, a method of operating a system on chip (SoC) includes executing a first boot loader stored in an internal read-only memory (ROM) based on a reset signal; selecting one of non-volatile memories as a booting device using the first boot loader; loading a second boot loader from the booting device into a first internal static random access memory (SRAM) and loading a third boot loader from the booting device into a second internal SRAM; and loading an operating system (OS) from the booting device into a main memory as the second boot loader is executed.

The method may further include executing the second boot loader, wherein the second boot loader is executed after the third boot loader loaded into the second internal SRAM passes integrity checking.

The non-volatile memories may be flash-based memories.

The method may further include causing the SoC to enter a power-down mode; cutting off a power supply to the internal ROM and the first internal SRAM during the power-down mode; and continuing supplying power to the second internal SRAM in the power-down mode.

The method may further include executing the first boot loader based on a wake-up interrupt signal; executing, using the first boot loader, the third boot loader stored in the second internal SRAM; and jumping to the OS loaded into the main memory, using the third boot loader.

The method may further include performing integrity checking on at least one of the second boot loader, the third boot loader, and the OS.

The reset signal may be one of a hardware reset signal, a watchdog reset signal, and a software reset signal.

According to example embodiments, a system on chip (SoC) includes an internal read-only memory (ROM) configured to store a first boot loader; a first internal static random access memory (SRAM) configured to receive a second boot loader output from a booting device, store the second boot loader, and perform a booting sequence according to control of the first boot loader; a second internal SRAM configured to receive a third boot loader output from the booting device, store the third boot loader, and perform a wake-up sequence according to control of the first boot loader; and a dynamic random access memory (DRAM) controller configured to load an operating system (OS) from the booting device into a DRAM according to control of the second boot loader.

The first internal SRAM and the second internal SRAM may be respectively implemented in different power domains, the SoC being configured to control the different power domains independently with respect to one another.

The SoC may further include a power management unit (PMU) configured to cut off a power supply to the internal ROM, the first internal SRAM, and the DRAM controller and to continue supplying power to the second internal SRAM after the SoC enters a power-down mode.

The PMU may resume supplying power to the internal ROM, the first internal SRAM, and the DRAM controller based on a wake-up interrupt signal, the first boot loader may be executed based on the wake-up interrupt signal; and the third boot loader may jump to the OS loaded into the DRAM, the first boot loader being executed by the first boot loader.

According to example embodiments, an application processor may include an internal read-only memory (ROM) configured to store a first boot loader; a first internal static random access memory (SRAM) configured to receive a second boot loader output from a booting device, store the second boot loader, and perform a booting sequence according to control of the first boot loader; a second internal SRAM configured to receive a third boot loader output from the booting device, store the third boot loader, and perform a wake-up sequence according to control of the first boot loader; and a dynamic random access memory (DRAM) controller configured to load an operating system (OS) from the booting device into a DRAM according to control of the second boot loader.

The application processor may further include a power management unit (PMU) configured to cut off a power supply to the internal ROM, the first internal SRAM, and the DRAM controller and to continue supplying power to the second internal SRAM after the SoC enters a power-down mode.

The PMU may resume supplying power to the internal ROM, the first internal SRAM, and the DRAM controller based on a wake-up interrupt signal; the first boot loader may be executed based on the wake-up interrupt signal; and the third boot loader may jump to the OS loaded into the DRAM, the first boot loader being executed by the first boot loader.

According to example embodiments, a computer system may include a system on chip (SoC); a booting device connected to the SoC; and a dynamic random access memory (DRAM) connected to the SoC, wherein the SoC includes, an internal read-only memory (ROM) configured to store a first boot loader; a first internal static random access memory (SRAM) configured to receive a second boot loader output from a booting device, store the second boot loader, and perform a booting sequence according to control of the first boot loader; a second internal SRAM configured to receive a third boot loader output from the booting device, store the third boot loader, and perform a wake-up sequence according to control of the first boot loader; and a dynamic random access memory (DRAM) controller configured to load an operating system (OS) from the booting device into a DRAM according to control of the second boot loader.

The first internal SRAM and the second internal SRAM may be respectively implemented in different power, the SoC being configured to control the different power domains independently with respect to one another.

The computer system may further include a power management unit (PMU) configured to cut off a power supply to the internal ROM, the first internal SRAM, and the DRAM controller and to continue supplying power to the second internal SRAM after the SoC enters a power-down mode.

The PMU may resume supplying power supply to the internal ROM, the first internal SRAM, and the DRAM controller based on a wake-up interrupt signal; the first boot loader may be executed based on the wake-up interrupt signal; and the third boot loader may jump to the OS loaded into the DRAM, the first boot loader being executed by the first boot loader.

The computer system may further include a power supply control device configured to cut off a power supply to the booting device when the SoC is in a power-down mode and to resume the supplying power to the booting device when the SoC wakes up.

The computer system may be at least one of a smart phone, a tablet personal computer, a wearable computer, and a mobile internet device.

According to example embodiments, a method of operating a system on chip (SoC) includes executing a first boot loader code stored in the in a read-only memory (ROM) of SoC; causing, using the first boot loader code, a second boot loader code and a third boot loader code to be loaded from a boot device into the SoC, the second and third boot loader codes being loaded into a first static random access memory (SRAM) of the SoC and a second SRAM of the SoC, respectively; causing, using the second boot loader code, operating system (OS) code to be loaded from the boot device into main memory of the SoC and executed; entering a power-down mode of the SoC in which power is cut for at least some elements of the SoC, the at least some elements including the first SRAM and not including the second SRAM; performing a wake-up operation of the SoC in which power is restored to elements of the SoC; and causing, using the third boot loader code, the OS code to be executed during the wake-up operation.

The method may further include during the wake-up mode, executing the first boot loader code; and jumping to an address of the third boot loader code in the second SRAM and causing the third boot loader code to be executed, using the first boot loader code.

During the wake-up operation, execution of the OS may be initiated without using the second boot code or loading boot code from the boot device.

The second boot loader code, the third boot loader code and the OS may be loaded from a nonvolatile memory included in the boot device.

BRIEF DESCRIPTION OF THE DRAWINGS

The above and other features and advantages of example embodiments of the inventive concepts will become more apparent by describing in detail example embodiments of the inventive concepts with reference to the attached drawings. The accompanying drawings are intended to depict example embodiments of the inventive concepts and should not be interpreted to limit the intended scope of the claims. The accompanying drawings are not to be considered as drawn to scale unless explicitly noted.

DETAILED DESCRIPTION OF THE EMBODIMENTS

Figure 1:
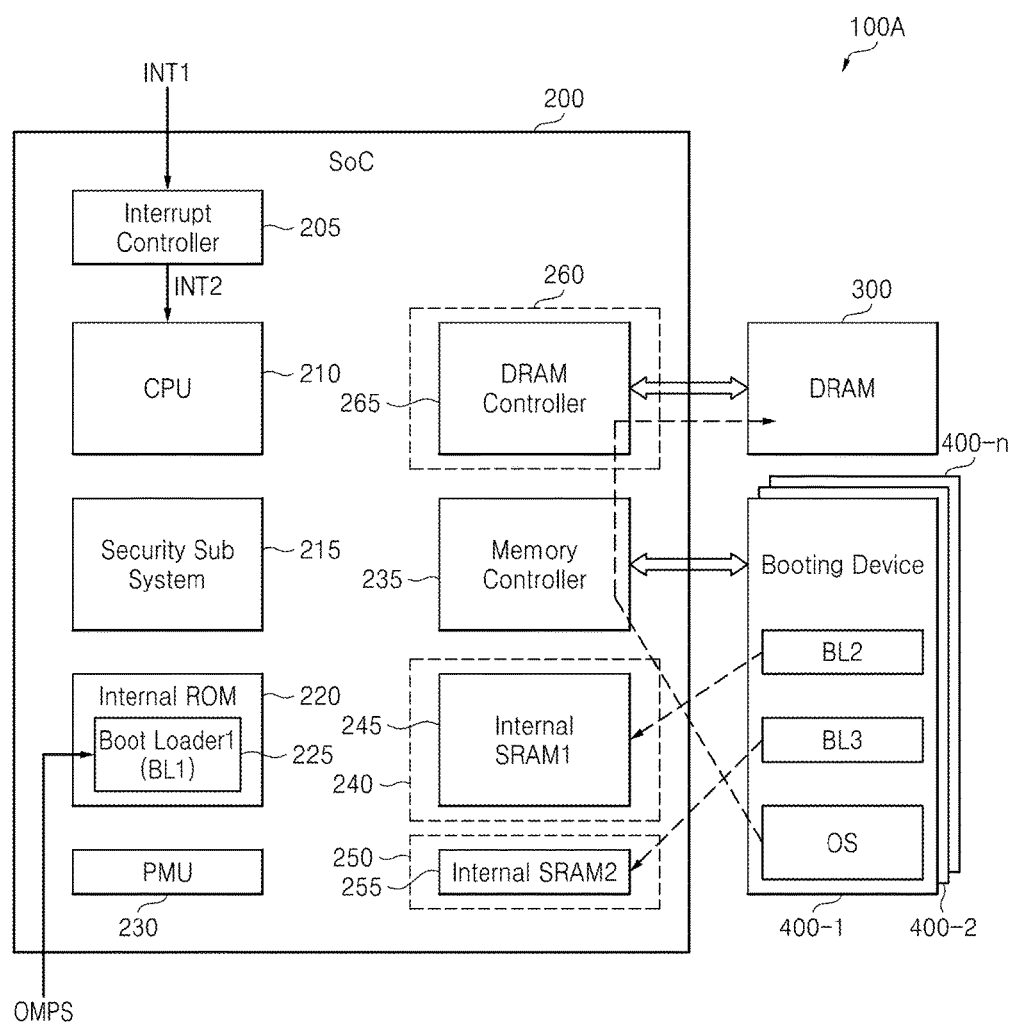
FIG. 1 is a block diagram of a computer system according to example embodiments of the inventive concepts.

Detailed example embodiments of the inventive concepts are disclosed herein. However, specific structural and functional details disclosed herein are merely representative for purposes of describing example embodiments of the inventive concepts. Example embodiments of the inventive concepts may, however, be embodied in many alternate forms and should not be construed as limited to only the embodiments set forth herein.

Accordingly, while example embodiments of the inventive concepts are capable of various modifications and alternative forms, embodiments thereof are shown by way of example in the drawings and will herein be described in detail. It should be understood, however, that there is no intent to limit example embodiments of the inventive concepts to the particular forms disclosed, but to the contrary, example embodiments of the inventive concepts are to cover all modifications, equivalents, and alternatives falling within the scope of example embodiments of the inventive concepts Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the inventive concepts. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the inventive concepts. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a block diagram of a computer system 100A according to example embodiments of the inventive concepts.

In the example illustrated in FIG. 1A, the computer system 100A includes a system on chip (SoC) 200, a main memory 300, and a plurality of non-volatile memories 400-1 through 400-n. The computer system 100A may be an electronic system that requires booting or booting up. The computer system 100A may be personal computer (PC), a data server, consumer electronics (CE), or a portable electronic device.

Examples of CE may include audio equipment, television (TV) sets, smart TV, and smart refrigerators. Examples of portable electronic devices may a laptop computer, a cellular phone, a smart phone, a tablet PC, a personal digital assistant (PDA), an enterprise digital assistant (EDA), a digital still camera, a digital video camera, a portable multimedia player (PMP), a personal navigation device or portable navigation device (PND), a handheld game console, a mobile internet device (MID), a wearable computer, or an e-book.

The SoC 200 may communicate with the main memory 300 and each of the non-volatile memories 400-1 through 400-n through an interface. The SoC 200 may function as a control device that controls data communication between the main memory 300 and each of the non-volatile memories 400-1 through 400-n.

The SoC 200 may be embedded in an application processor. The SoC 200, the main memory 300, and the non-volatile memories 400-1 through 400-n may be mounted on a printed circuit board (PCB) or a main board. In the example illustrated in FIG. 1, the SoC 200 includes an interrupt controller 205, a central processing unit (CPU) 210, a security sub system 215, an internal read-only memory (ROM) 220, a power management unit (PMU) 230, a memory controller 235, a first internal static random access memory (SRAM) 245, a second internal SRAM 255, and a main memory controller 265.

The interrupt controller 205 may generate an interrupt INT2 corresponding to a reset signal INT1 received at the SoC 200 from outside the SoC 200. The reset signal INT1 may be, for example, a hardware reset signal, a watchdog reset signal, a software reset signal, or a wake-up reset signal for wake-up from power-down mode. The interrupt INT2 may be, for example, an interrupt for hardware reset, watchdog reset, or software reset or a wake-up interrupt for wake-up.

The CPU 210 may control the operation of the SoC 200. For example, the CPU 210 may control the operations of the elements 205, 215, 220, 230, 235, 245, 255, and/or 265. The CPU 210 may be implemented as a multi-core CPU. The security sub system 215 may perform data security on the SoC 200.

A first boot loader BL1 may be stored in a storage area 225 of the internal ROM 220. The SoC 200 may boot from the first boot loader BL1 stored in the storage area 225 of the internal ROM 220 to enable secure booting. The first boot loader BL1 may be composed of, for example, small and simple code, and may be platform-independent. When a reset operation or a wake-up operation is executed based on the interrupt INT2, the first boot loader BL1 in the internal ROM 220 may cause a program counter to start .

The PMU 230 may control the supply of an operating voltage or power to any or all of the elements 205, 210, 215, 220, 235, 245, 255, and 265. Any or all of the elements 205, 210, 215, 220, 235, 245, and 265 (excluding the second internal SRAM 255) may be implemented together in a power domain or may be implemented separately in different power domains.

The memory controller 235 may control the transfer of commands and/or data among the first internal SRAM (hereinafter, referred to as iSRAM1) 245, the second internal SRAM (hereinafter, referred to as iSRAM2) 255, the main memory controller 265, and the non-volatile memories 400-1 through 400-n.

The iSRAM1 245 may receive and store a second boot loader BL2 output from a booting device, i.e., the non-volatile memory 400-1 according to the control of the memory controller 235. The iSRAM2 255 may receive and store a third boot loader BL3 output from the booting device 400-1 according to the control of the memory controller 235.

The capacity of the iSRAM2 255 may be configured to be less than that of the iSRAM1 245 in order to reduce power consumption in power-down mode. The main memory controller 265 may control the transfer of commands and/or data among the CPU 210, the memory controller 235, and the main memory 300.

For clarity of the description, it is assumed in the embodiments illustrated in FIG. 1 that the iSRAM1 245 is included in a first power domain 240, the iSRAM2 255 is included in a second power domain 250, and the main memory controller 265 is included in a third power domain 260. However, other arrangements may be used. Further, according to example embodiments, it may be desirable to arrange the first power domain 240 including the iSRAM1 245 and the second power domain 250 including the iSRAM2 255 to be separated from each other. The PMU 230 may independently control the cut-off and supply of the operating voltage to the power domains 240, 250, and 260.

The main memory 300 may store, for example, an operating system (OS), an application (or application code), and data. The main memory 300 may be implemented as a dynamic random access memory (DRAM).

The booting device 400-1 may be a non-volatile memory. The booting device 400-1 may store the second boot loader BL2, the third boot loader BL3, and the OS. The second boot loader BL2 may be a boot loader for a booting sequence including, for example, a hardware reset, watchdog reset, or software reset. According to example embodiments, the third boot loader BL3 may be an exclusive boot loader for a wake-up sequence including, for example, wake-up from a power-down mode.

The non-volatile memories 400-1 through 400-n may, for example, be flash-based memories. Examples of the first non-volatile memory 400-1 include a multimedia card (MMC), an embedded MMC (eMMC), or a secure digital (SD) card. The second non-volatile memory 400-2 may be an embedded solid state drive (eSSD), a NAND flash memory, a NOR flash memory, or a universal flash storage (UFS). The n-th non-volatile memory 400-n may be a storage device having a universal asynchronous receiver/transmitter (UART) or universal serial bus (USB) interface.

During a booting sequence, the first boot loader BL1 may select one of the non-volatile memories 400-1 through 400-n as a booting device based on a state OMPS of operating mode pins. Here, it is assumed that the first non-volatile memory 400-1 is selected by the first boot loader BL1 as a booting device. As an example, according to at least one example embodiment of the inventive concepts, when the state OMPS [5:1] of the operating mode pins is 5b'00010, the first boot loader BL1 selects non-volatile memory 400-1 as a booting device; when the state OMPS [5:1] of the operating mode pins is 5b'01000, the first boot loader BL1 selects non-volatile memory 400-2 as a booting device; and when the state OMPS [5:1] of the operating mode pins is 5b'11000, the first boot loader BL1 selects non-volatile memory 400-n as a booting device.

The memory controller 235 may be, for example, a set of controllers that control the non-volatile memories 400-1 through 400-n, respectively. The memory controller 235 may include one or more of an MMC controller, an eMMC controller, an SD card controller, an eSSD controller, a NAND flash controller, a NOR flash controller, a UFS controller, a UART controller, and a USB controller. According to example embodiments, the type or and the number of controllers included in the memory controller 235 may be determined based on the type of and the number of the non-volatile memories 400-1 through 400-n included in the computer system 100A.

Figure 2:
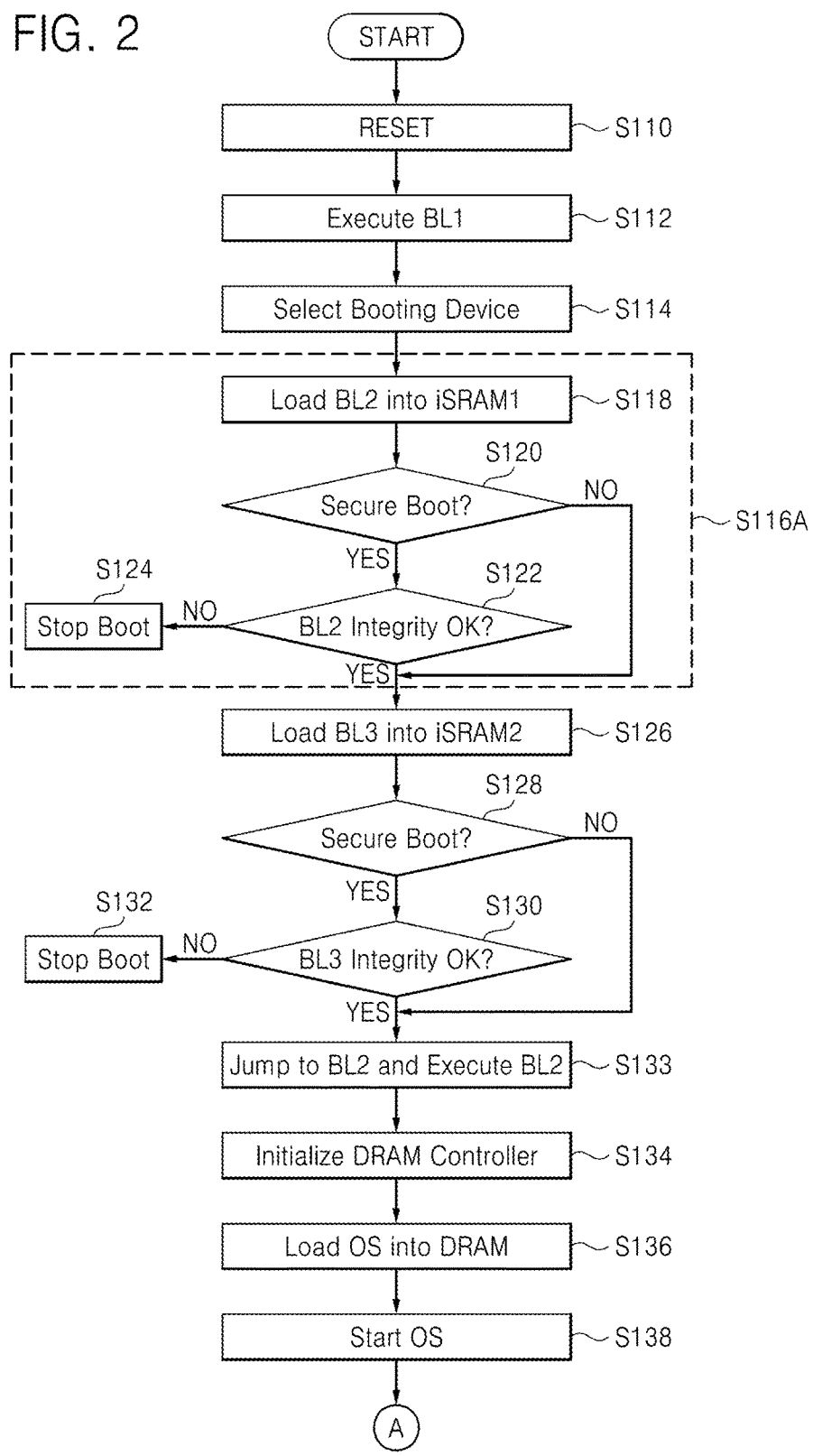
FIG. 2 is a flowchart of a booting sequence of the computer system illustrated in FIG. 1.

FIG. 2 is a flowchart of a booting sequence of the computer system 100A illustrated in FIG. 1. The booting sequence (or boot) of the computer system 100A will be described in detail with reference to FIGS. 1 and 2.

The PMU 230 may supply an operating voltage to the elements 205, 210, 215, 220, 235, 245, 255, and 265 in response to the interrupt INT2 corresponding to the reset signal INT1, which may be, for example, the hardware reset signal, the watchdog reset signal, or the software reset signal.

When the SoC 200 is reset in operation S110, the first boot loader BL1 stored in the storage area 225 of the internal ROM 220 may be executed according to the control of the CPU 210 in operation S112. The first boot loader BL1 selects one non-volatile memory 400-1 as a booting device from among the non-volatile memories 400-1 through 400-n based on the state OMPS of the operating mode pins in operation S114. The first boot loader BL1 loads the second boot loader BL2 from the booting device 400-1 into the iSRAM1 245 using the memory controller 235 in operation S118. The size of the second boot loader BL2 may be determined based on software.

When secure boot is desired (in case of YES) in operation S120, the first boot loader BL1 performs integrity checking on the second boot loader BL2 loaded into the iSRAM1 245 in operation S122. When the second boot loader BL2 passes the integrity checking (in case of YES) in operation S122, the first boot loader BL1 loads the third boot loader BL3 from the booting device 400-1 into the iSRAM2 255 using the memory controller 235 in operation S126.

When the second boot loader BL2 fails the integrity checking (in case of NO) in operation S122, the first boot loader BL1 is stopped and the boot operation is stopped in operation S124. When the secure boot is not desired (in case of NO) in operation S120, the first boot loader BL1 loads the third boot loader BL3 from the booting device 400-1 into the iSRAM2 255 using the memory controller 235 in operation S126.

When secure boot is desired (in case of YES) in operation S128, the first boot loader BL1 performs integrity checking on the third boot loader BL3 loaded into the iSRAM2 255 in operation S130. When the third boot loader BL3 passes the integrity checking (in case of YES) in operation S130, the first boot loader BL1 jumps to an address of the second boot loader BL2 loaded to the iSRAM1 245 in operation S133. The address may be determined depending on a user's software.

However, in other embodiments, a program counter indicating a start address of the CPU 210 may start from the third boot loader BL3 in the iSRAM2 255 in response to the wake-up interrupt INT2 in order to reduce a booting time.

When the third boot loader BL3 fails the integrity checking (in case of NO) in operation S130, the first boot loader BL1 is stopped and the boot is stopped in operation S132. When the secure boot is not desired (in case of NO) in operation S128, the first boot loader BL1 jumps to the address of the second boot loader BL2 loaded to the iSRAM1 245 in operation S133.

When the secure boot is successfully completed with respect to the second and third boot loaders BL2 and BL3, or when the secure boot is not desired for the second and third boot loaders BL2 and BL3, the second boot loader BL2 is executed by the CPU 210 in operation S133. The second boot loader BL2 initializes desired peripheral devices including, for example, a system clock, a storage device having UART interface, and/or the main memory controller 265 in operation S134.

The second boot loader BL2 loads the OS or an OS image from the booting device 400-1 into the main memory 300 using the memory controllers 235 and 265 in operation S136. Further, the second boot loader BL2 may jump to an address of the OS loaded into the main memory 300. As a result, the OS is started in operation S138. The address may be determined depending on a user's software. Consequently, the booting sequence is completed.

Figure 3:
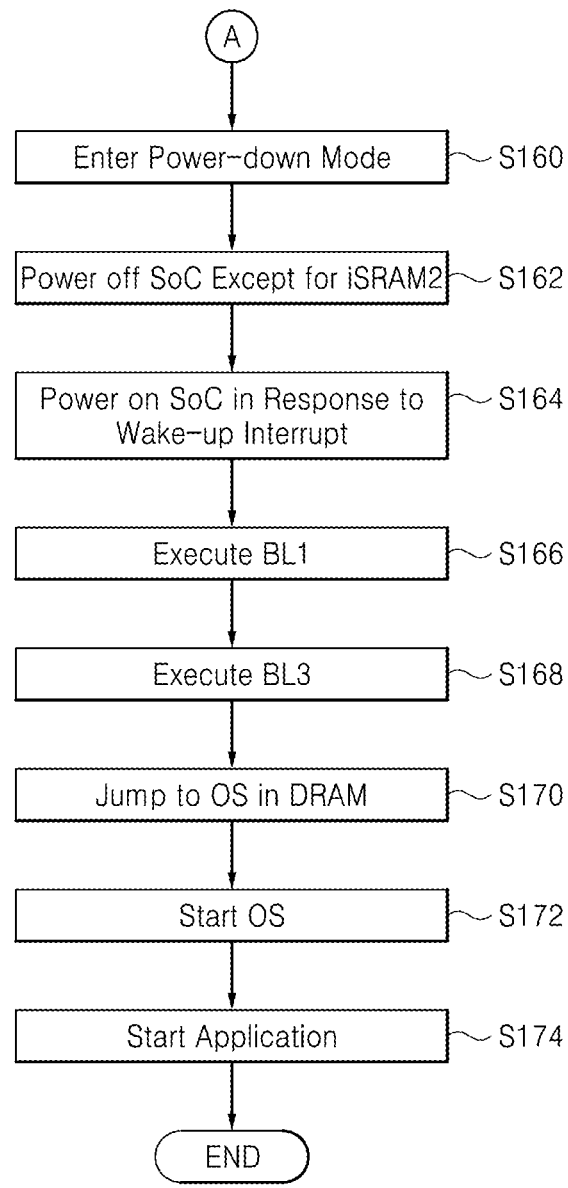
FIG. 3 is a flowchart of a wake-up sequence of the computer system illustrated in FIG. 1.

FIG. 3 is a flowchart of a wake-up sequence of the computer system 100A illustrated in FIG. 1. The wake-up sequence of the computer system 100A will be described in detail with reference to FIGS. 1 and 3.

The computer system 100A that has been normally booted using the booting sequence may enter a power-down mode according to use conditions in operation S160. The power-down mode may be referred to by various names including low power mode, sleep mode, standby, sleep, or suspend.

When the computer system 100A enters the power-down mode in operation S160, the PMU 230 supplies power to only the iSRAM2 255 in the second power domain 250 and cuts off the power supply to the other power domains 240 and 260 in operation S162. Further, during the power-down mode of the computer system 100A, power supplied to the DRAM 300 is not cut off. Since the power is not supplied to the iSRAM1 245, data stored in the iSRAM1 245 may be lost or erased during the power-down mode of the computer system 100A. However, according to at least one example embodiment of the inventive concepts, data stored in the iSRAM2 255 and data stored in the DRAM 300 are retained during the power-down mode of the computer system 100A.

According to example embodiments, the PMU 230 may cut off the power supply to all elements 210, 215, 220, 235, 245, and 265 except for the interrupt controller 205 and the iSRAM2 255.

In further embodiments, when the computer system 100A enters the power-down mode in operation S160, the power supply to the non-volatile memories 400-1 through 400-*n* may also be cut off and then may be resumed in response to the wake-up interrupt INT2. In this case, the power supply to the non-volatile memories 400-1 through 400-*n* may be controlled by the PMU 230 or a separate power supply control device. The power supply control device may be included in the computer system 100A and the power supply control device may be implemented as a power management integrated circuit (PMIC).

When the computer system 100A enters the power-down mode, the PMU 230 may store the power states of the respective elements 205, 210, 215, 220, 235, 245, 255, and 265 in, for example an, internal memory or register of the PMU 230. The interrupt controller 205 may generate the wake-up interrupt INT2 in response to the wake-up reset signal INT1.

The PMU 230 may resume the supply of an operating voltage to the elements 210, 215, 220, 235, 245, and 265 in response to the wake-up interrupt INT2 in operation S164. As described above, unless the computer system 100A is powered off, the PMU 230 may continuously supply the power to the second power domain 250 including the iSRAM2 255.

The CPU 210 executes the first boot loader BL1 in response to the wake-up interrupt INT2 in operation S166. At this time, the CPU 210 may execute the first boot loader BL1 corresponding to the wake-up sequence with reference to the power states stored in the internal memory or the internal register of the PMU 230.

The first boot loader BL1 jumps to an address of the third boot loader BL3 loaded into the iSRAM2 255 according to the control of the CPU 210. The address may be determined depending on a user's software.

According to example embodiments, a program counter indicating a start address of the CPU 210 may start from the third boot loader BL3 in the iSRAM2 255 in response to the wake-up interrupt INT2 in order to reduce a booting time.

The third boot loader BL3 is executed by the CPU 210 in operation S168. The third boot loader BL3 initializes the main memory controller 265 and jumps to an address of the OS loaded into the main memory 300 in operation S170. Accordingly, the OS is started in operation S172 and a desired application is started in operation S174. Consequently, the OS is restored to a previous state.

When the third boot loader BL3 does not exist in the iSRAM2 255 in the power-down mode, it may be necessary for the SoC 200 to re-load the second boot loader BL2 from the booting device 400-1 into the iSRAM1 245 and perform, again, the integrity checking on the second boot loader BL2 loaded into the iSRAM1 245 using the first boot loader BL1. Through these processes, a wake-up time increases.

According to the example embodiments of the inventive concepts, the third boot loader BL3 is retained in the iSRAM2 255 in the power-down mode, so that the SoC 200 can start the OS stored in the main memory 300 using the third boot loader BL3.

According to example embodiments of the inventive concepts, when the SoC 200 wakes up from the power-down mode, the SoC 200 does not need to re-load the second boot loader BL2 from the booting device 400-1 into the iSRAM1 245 and does not need to perform the integrity checking on the second boot loader BL2, and therefore, the wake-up time may be reduced.

In addition, the SoC 200 may also avoid consuming the power necessary for the re-load of the second boot loader BL2 into the iSRAM1 245, for the integrity checking on the second boot loader BL2, and for the execution of the second boot loader BL2. Moreover, the SoC 200 may not need to access the booting device 400-1 when waking up from the power-down mode, and therefore, the lifespan of the booting device 400-1 may be increased when the booting device 400-1 is implemented as a flash-based memory.

According to example embodiments, the SoC 200 may not need to re-load the second boot loader BL2 and the third boot loader BL3 from the booting device 400-1 when waking up from the power-down mode. Consequently, wake-up time may be reduced.

Figure 4:
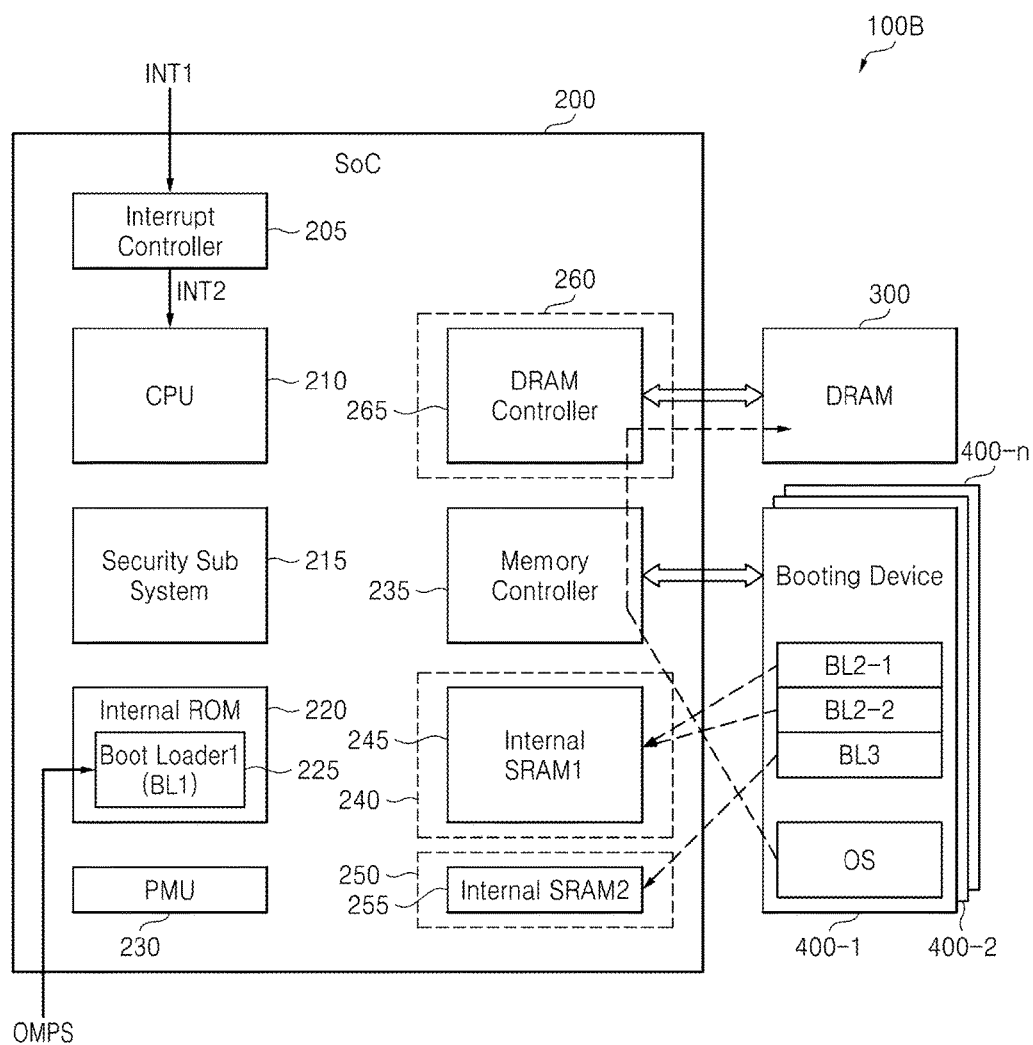
FIG. 4 is a block diagram of a computer system according to example embodiments of the inventive concept.

FIG. 4 is a block diagram of a computer system 100B according to example embodiments of the inventive concepts. Referring to FIGS. 1 and 4, the structure and operation of the computer system 100B illustrated in FIG. 4 may be the same or, alternatively, substantially the same as those of the computer system 100A illustrated in FIG. 1, with the exception that the booting device 400-1 stores first and second sub boot loaders BL2-1 and BL2-2 in addition to the third boot loader BL3 and the OS, and the two boot loaders BL2-1 and BL2-2 are sequentially loaded into the iSRAM1 245.

For example, the first sub boot loader BL2-1 may be composed of a small and simple code, may be platform-independent, and may be related with a secure boot operation. The second sub boot loader BL2-1 may be composed of a more complicated code than the first sub boot loader BL2-1, and may be platform-specific.

Figure 5:
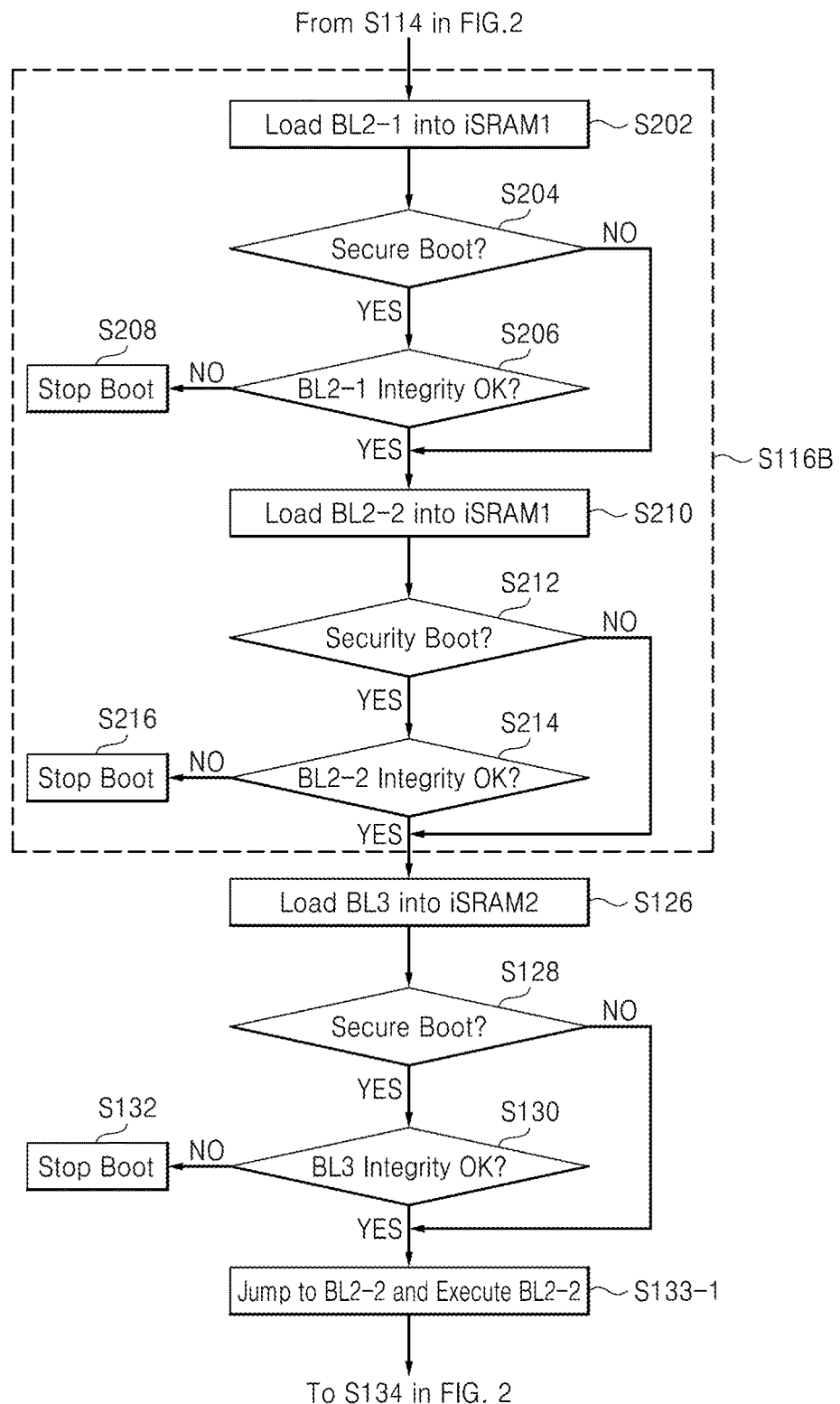
FIG. 5 is a flowchart of a booting sequence of the computer system illustrated in FIG. 4.

FIG. 5 is a flowchart of a booting sequence of the computer system 100B illustrated in FIG. 4. According to example embodiments, the process illustrated in FIG>5 may be the same as that illustrated in FIG. 2 with the exception that the operations S116B and S133-1 illustrated in FIG. 5 may replace the operations S116A and S133 illustrated in FIG. 2, respectively.

A procedure for loading the first and second sub boot loaders BL2-1 and BL2-2 from the booting device 400-1 into the iSRAM1 245 will be described in detail with reference to FIGS. 2, 4, and 5.

With reference to FIG. 2, when the SoC 200 is reset in operation S110, the first boot loader BL1 stored in the storage area 225 of the internal ROM 220 is executed according to the control of the CPU 210 in operation S112. The first boot loader BL1 selects one non-volatile memory 400-1 as a booting device from among the non-volatile memories 400-1 through 400-*n* based on the state OMPS of the operating mode pins in operation S114. With reference to FIG.5, the first boot loader BL1 loads the first sub boot loader BL2-1 from the booting device 400-1 into the iSRAM1 245 using the memory controller 235 in operation S202.

When a secure boot operation is desired (in case of YES) in operation S204, the first boot loader BL1 performs integrity checking on the first sub boot loader BL2-1 loaded to the iSRAM1 245 in operation S206. When the first sub boot loader BL2-1 passes the integrity checking (in case of YES) in operation S206, the first boot loader BL1 or the first sub boot loader BL2-1 loads the second sub boot loader BL2-2 from the booting device 400-1 into the iSRAM1 245 using the memory controller 235 in operation S210.

When the first sub boot loader BL2-1 fails the integrity checking (in case of NO) in operation S206, the first boot loader BL1 or the first sub boot loader BL2-1 is stopped and the boot is stopped in operation S208.

When the secure boot is not desired (in case of NO) in operation S204, the first boot loader BL1 or the first sub boot loader BL2-1 loads the second sub boot loader BL2-2 from the booting device 400-1 into the iSRAM1 245 using the memory controller 235 in operation S210.

When secure boot is desired (in case of YES) in operation S212, the first boot loader BL1 or the first sub boot loader BL2-1 performs integrity checking on the second sub boot loader BL2-2 loaded into the iSRAM1 245 in operation S214. When the second sub boot loader BL2-2 passes the integrity checking (in case of YES) in operation S214, the first boot loader BL1 or the first sub boot loader BL2-1 loads the third boot loader BL3 into the iSRAM2 255 in operation S126. When the second sub boot loader BL2-2 fails the integrity checking (in case of NO) in operation S214, the first boot loader BL1 or the first sub boot loader BL2-1 is stopped and the boot is stopped in operation S216.

When secure boot is not desired (in case of NO) in operation S212, the first boot loader BL1 or the first sub boot loader BL2-1 loads the third boot loader BL3 from the booting device 400-1 into the iSRAM2 255 in operation S126.

When secure boot is desired (in case of YES) in operation S128, the first boot loader BL1 or the first sub boot loader BL2-1 performs integrity checking on the third boot loader BL3 loaded into the iSRAM2 255 in operation S130. When the third boot loader BL3 passes the integrity checking (in case of YES) in operation S130, the first boot loader BL1 or the first sub boot loader BL2-1 jumps to the second sub boot loader BL2-2 loaded into the iSRAM1 245 in operation S133-1. When the third boot loader BL3 fails the integrity checking (in case of NO) in operation S130, the first boot loader BL1 or the first sub boot loader BL2-1 is stopped and the boot is stopped in operation S132.

When secure boot is not desired (in case of NO) in operation S128, the first boot loader BL1 or the first sub boot loader BL2-1 jumps to an address of the second sub boot loader BL2-2 loaded into the iSRAM1 245 in operation S133-1. The address may be determined depending on a user's software.

The second sub boot loader BL2-2 initializes desired peripheral devices, e.g., a system clock, a storage device having UART interface, and/or the main memory controller 265 in operation S134 (FIG. 2). The second sub boot loader BL2-2 loads the OS or an OS image from the booting device 400-1 into the main memory 300 using the memory controllers 235 and 265 in operation S136 (FIG. 2).

According to example embodiments the second sub boot loader BL2-2 may jump to an address of the OS loaded into the main memory 300 and, afterwards, the OS is started in operation S138 (FIG. 2). The entrance (S160) of the computer system 100B, which has been normally booted through the booting sequence, into the power-down mode and the wake-up sequence of the computer system 100B are substantially the same as described with reference to FIG. 3.

As described above, according to example embodiments of the inventive concepts, a computer system may use a boot loader used for a booting sequence and a boot loader used for a wake-up sequence independently, and thus, the computer system may quickly wake up from power-down mode, thereby reducing a wake-up time. In addition, a computer system according to example embodiments may reduce an amount of power consumed during the loading, checking and executing of boot loaders used for the booting sequence. Moreover, since a computer system according to example embodiments may not need to access a booting device that stores the boot loader used for the booting sequence when it wakes up from the power-down mode, the lifespan of the booting device may be increased when the booting device is a flash-based memory.

Example embodiments having thus been described, it will be obvious that the same may be varied in many ways. Such variations are not to be regarded as a departure from the intended spirit and scope of example embodiments of the inventive concepts, and all such modifications as would be obvious to one skilled in the art are intended to be included within the scope of the following claims.

What is claimed is:

1. An application processor comprising:
an internal read-only memory (ROM) configured to store a first boot loader;
a first internal static random access memory (SRAM) configured to receive a second boot loader from a booting device, configured to store the second boot loader, and configured to perform a booting sequence;
a second internal SRAM configured to receive a third boot loader from the booting device, configured to store the third boot loader, and configured to perform a wake-up sequence; and
a main memory controller configured to load an operating system (OS) from the booting device to an external memory based on a control of the second boot loader or a control of the third boot loader,
wherein, during a first mode, power is supplied both to the first internal SRAM and to the second internal SRAM,
during the first mode, the main memory controller is configured to load the OS to the external memory using the second boot loader stored in the first internal SRAM,
during a second mode, power is not supplied to the first internal SRAM and power is supplied to the second internal SRAM, and
during a wake-up operation following the second mode, the main memory controller is configured to load the OS to the external memory using the third boot loader stored in the second internal SRAM.

2. The application processor of claim 1, wherein the second mode is a power-down mode.

3. The application processor of claim 1, further comprising:
a memory controller configured to control transfer of commands and/or data among the first internal SRAM, the second internal SRAM, and the main memory controller.

4. The application processor of claim 1, wherein a capacity of the second internal SRAM is less than that of the first internal SRAM.

5. The application processor of claim 1, wherein a first power domain including the first internal SRAM and a second power domain including the second internal SRAM are separated from each other.

6. The application processor of claim 5, further comprising:

a power management unit (PMU) configured to control a cut-off or a supply of an operating voltage to the first and second power domains.

7. The application processor of claim 6, further comprising:
an interrupt controller configured to generate a wake-up interrupt signal, wherein the PMU is configured to cut off or supply the operating voltage to the first and second power domains in response to the wake-up interrupt signal.

8. The application processor of claim 1, wherein the main memory controller is a dynamic random access memory (DRAM) controller.

9. An application processor comprising:
an internal read-only memory (ROM) configured to store a first boot loader;
a first internal static random access memory (SRAM) configured to receive a second boot loader from a booting device, configured to store the second boot loader, and configured to perform a booting sequence;
a second internal SRAM configured to receive a third boot loader from the booting device, configured to store the third boot loader, and configured to perform a wake-up sequence; and
a main memory controller configured to load an operating system (OS) from the booting device to an external main memory,
wherein, during a power-down mode, power is not supplied to the first internal SRAM and the power is supplied to the second internal SRAM, and
during a wake-up operation following the power-down mode, the main memory controller is configured to load the OS to the external main memory using the third boot loader stored in the second internal SRAM.

10. The application processor of claim 9, wherein, during a normal mode, the power is supplied both to the first internal SRAM and to the second internal SRAM, and
during the normal mode, the main memory controller is configured to load the OS to the external memory using the second boot loader stored in the first internal SRAM.

11. The application processor of claim 9, further comprising:
a CPU configured to control an execution of the first boot loader stored in the internal ROM.

12. The application processor of claim 9, wherein the power-down mode includes a low power mode, a sleep mode, a standby mode, or a suspend mode.

13. The application processor of claim 9, wherein, during the wake-up operation, the third boot loader initializes the main memory controller and jumps to an address of the OS loaded into the external main memory.

14. The application processor of claim 9, wherein the first boot loader performs an integrity checking on the second boot loader and/or the third boot loader.

15. An application processor comprising:
an internal read-only memory (ROM) configured to store a first boot loader;
a first internal static random access memory (SRAM) configured to receive a second boot loader from a booting device, configured to store the second boot loader, and configured to perform a booting sequence;
a second internal SRAM configured to receive a third boot loader from the booting device, configured to store the third boot loader, and configured to perform a wake-up sequence; and
a dynamic random access memory (DRAM) controller configured to load an operating system (OS) from the booting device to a DRAM,
wherein, during a power-down mode, power is not supplied to the first internal SRAM and the power is supplied to the second internal SRAM, and
during a wake-up operation following the power-down mode, the first boot loader is configured to jump to the third boot loader stored in the second SRAM.

16. The application processor of claim 15, wherein during the wake-up operation, the DRAM controller is configured to load the OS to the DRAM using the third boot loader.

17. The application processor of claim 15, wherein, during a normal mode, the power is supplied both to the first internal SRAM and to the second internal SRAM, and
during the normal mode, the DRAM controller is configured to load the OS to the DRAM using the second boot loader stored in the first internal SRAM.

18. The application processor of claim 15, further comprising:
a security sub-system configured to perform data security.

19. The application processor of claim 15, wherein the first internal SRAM and the second internal SRAM are implemented separately in different power domains.

20. The application processor of claim 15, wherein during the wake-up operation, the power is restored to the first SRAM.

* * * * *